US010104798B2

United States Patent
AbuGhazaleh et al.

(10) Patent No.: US 10,104,798 B2
(45) Date of Patent: Oct. 16, 2018

(54) TELESCOPING SECURITY ENCLOSURE

(71) Applicant: Hubbell Incorporated, Shelton, CT (US)

(72) Inventors: Shadi Alex AbuGhazaleh, Guilford, CT (US); David Mark Peck, Danbury, CT (US); Richard James Merrell, New Haven, CT (US)

(73) Assignee: Hubbell Incorporated, Shelton, CT (US)

( * ) Notice: Subject to any disclaimer, the term of this patent is extended or adjusted under 35 U.S.C. 154(b) by 405 days.

(21) Appl. No.: 14/667,431

(22) Filed: Mar. 24, 2015

(65) Prior Publication Data

US 2015/0282373 A1    Oct. 1, 2015

Related U.S. Application Data

(60) Provisional application No. 61/969,892, filed on Mar. 25, 2014.

(51) Int. Cl.
*H05K 7/14*    (2006.01)
*H05K 7/18*    (2006.01)

(52) U.S. Cl.
CPC ............ *H05K 7/1488* (2013.01); *H05K 7/18* (2013.01)

(58) Field of Classification Search
CPC .. H05K 7/1488; H05K 7/1485; H05K 7/1495; H05K 7/18; H05K 7/186; H05K 5/0208; H05K 5/0221; H05K 5/0217; H05K 7/183; A47B 96/00
USPC ............ 361/679.4, 679.44; 211/26; 312/205, 312/270.1
See application file for complete search history.

(56) References Cited

U.S. PATENT DOCUMENTS

| | | | | |
|---|---|---|---|---|
| 581,834 A | * | 5/1897 | Stafford | A47B 45/00 312/205 |
| 874,442 A | * | 12/1907 | Sandel | B65D 21/086 220/8 |
| 930,743 A | * | 8/1909 | Derr | E06B 9/52 160/223 |
| 1,069,411 A | * | 8/1913 | Greene | A47B 71/00 126/20 |
| 1,120,955 A | * | 12/1914 | Martin | B65D 5/0005 220/8 |
| 1,203,380 A | * | 10/1916 | Martin | A47B 45/00 312/205 |

(Continued)

FOREIGN PATENT DOCUMENTS

DE    202012103372 U1 * 10/2012    ........... H05K 7/1488

OTHER PUBLICATIONS

International Search Report and the Written Opinion of the International Search Authority, or the Declaration in PCT/US2015/022307 dated Jun. 26, 2015.

(Continued)

*Primary Examiner* — Michael Safavi
(74) *Attorney, Agent, or Firm* — Wissing Miller LLP

(57) ABSTRACT

The present disclosure provides security enclosures for rack mounted network devices. The security enclosures include an adjustable enclosure body, and an adjustable locking cover operatively connected to the enclosure body. The cover is movable between a closed position and an open position, and the cover has a lock assembly to lock the cover to the enclosure body when the cover is in the closed position.

20 Claims, 15 Drawing Sheets

(56) References Cited

U.S. PATENT DOCUMENTS

| | | | | |
|---|---|---|---|---|
| 1,291,794 | A * | 1/1919 | Droste | A47C 17/86 312/205 |
| 1,917,980 | A * | 7/1933 | Kelsey | B42F 15/0035 312/183 |
| 2,953,244 | A * | 9/1960 | Phillips | A47F 5/10 108/63 |
| 3,508,802 | A * | 4/1970 | Schroer | A47B 45/00 312/205 |
| 4,025,137 | A * | 5/1977 | Wyler | A47B 45/00 108/93 |
| 4,729,614 | A | 3/1988 | Nadler et al. | |
| 5,713,502 | A * | 2/1998 | Dixon | B60R 7/02 190/103 |
| 5,738,425 | A * | 4/1998 | Rosenberg | A47B 88/90 220/8 |
| 6,030,060 | A * | 2/2000 | Drake | H05K 7/1425 206/708 |
| 7,009,839 | B2 | 3/2006 | Clinard | |
| 7,815,065 | B2 | 10/2010 | Gosche | |
| 7,946,433 | B2 | 5/2011 | Nguyen | |
| 8,117,973 | B1 * | 2/2012 | Frank | E05G 1/005 109/47 |
| 8,376,477 | B2 * | 2/2013 | Schinzing | A47B 45/00 312/205 |
| 8,459,756 | B2 | 6/2013 | Linhares | |
| 2007/0146997 | A1 | 6/2007 | Foster, Sr. | |
| 2016/0302323 | A1 * | 10/2016 | Gosselin | B23P 19/04 |

OTHER PUBLICATIONS

Product Pamphlet Pages—2012 Cooper B-Line, Inc., CDRSP_12, Rack Security Products, 6 pages.

Product Pamphlet pages, 2004-2012, Pathways & Spaces, Inc., 2 pages.

Secure Patch Security Cover, Pathways & Spaces, Inc. Instruction sheet, Oct. 31, 2009, 2 pages.

* cited by examiner

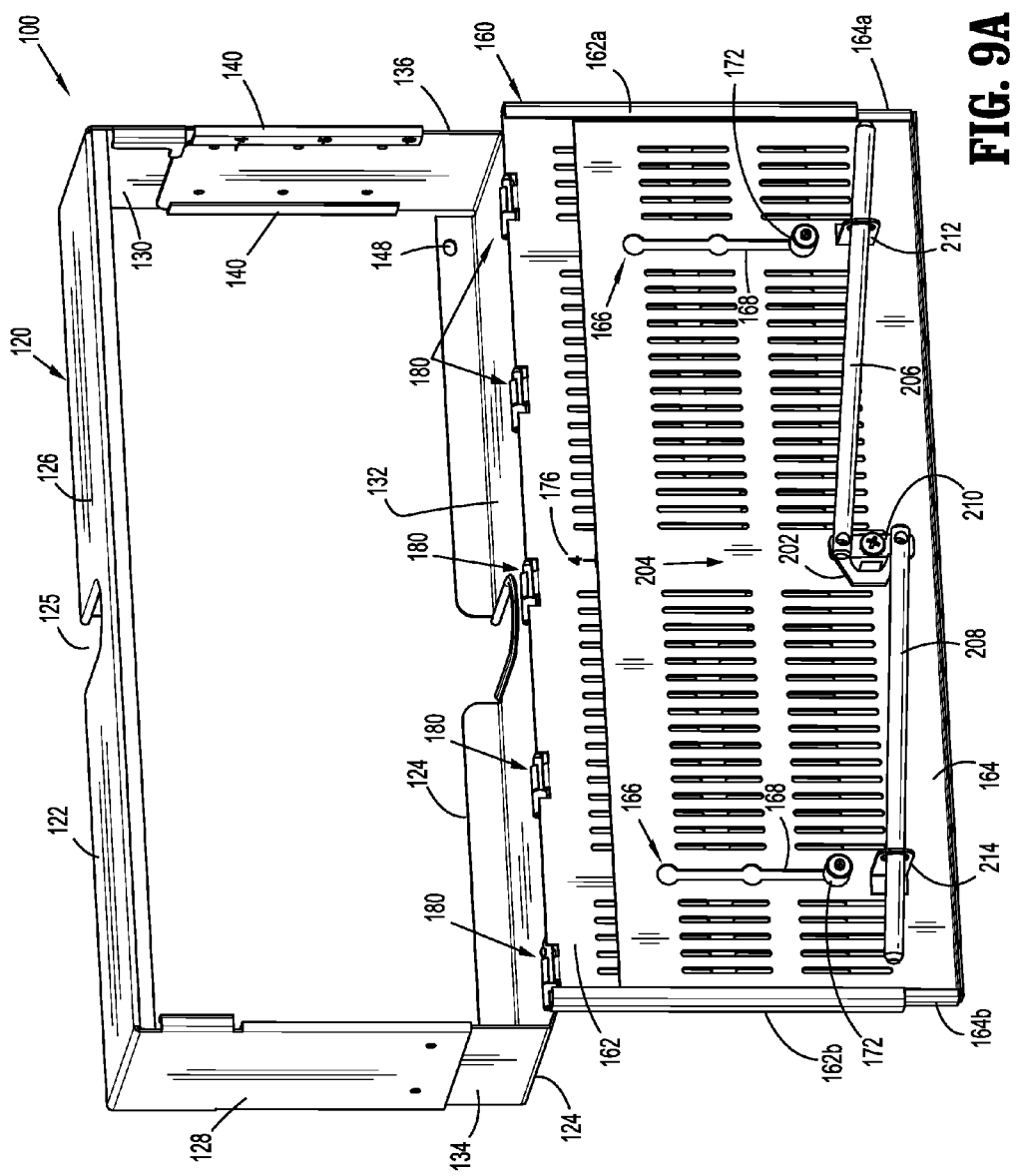

TELESCOPING SECURITY ENCLOSURE

CROSS-REFERENCE TO RELATED APPLICATIONS

This application claims priority to U.S. Provisional Application No. 61/969,892, filed on Mar. 25, 2014, entitled "TELESCOPING RAIL MOUNTED SECURITY ENCLOSURE" which is incorporated herein in its entirety by reference.

BACKGROUND

Field

The present disclosure relates generally to securing network infrastructures, and more particularly to racks, enclosures and other mounting structures for mounting network devices, and lockable cover assemblies used to secure the network devices.

Description of the Related Art

Data centers and telecommunication rooms house network infrastructure components and network devices, such as switches, routers, servers, storage devices, patch panels, and other electronic equipment, installed on racks, in enclosures, or cabinets, or other mounting structures. Referring to FIGS. 1 and 2, a rack 10 is generally a metal frame used to mount network devices, and resembles a shelving structure where network devices can be attached to the rack vertically and stacked one top of one another. Generally, individual network devices 22 are screwed onto a front surface 12 of the rack 10, which has tapped holes 14 (or cage nuts) spaced apart to accommodate network devices having various heights. The standard unit of measure for designating the vertical usable space in a rack, or the height of racks, is the letter "U" preceded by a whole number. This unit of measurement refers to the space between shelves on a rack. For example and referring to FIG. 2, a 1U network device has 1 rack space for network equipment, and has 1.725 inches of vertical usable space. As another example, a rack designated as 4U has 4 rack spaces for network equipment and has 7 inches of vertical usable space. Rack spaces and the network devices that fit into them are all measured in "U". While racks come in many different heights, the standard width size rack is 19 inches.

Physical network device security has been a growing area of concern for data center operators and vendors alike. The concerns vary from simple protection of the network equipment from occasional tampering, to fully securing the network equipment from all undesired access, and any type of tampering, sabotage, theft or other action that can cause disruption to the network.

Racks are typically placed in secured rooms as a first line of security to limit access to or unauthorized removal of the network infrastructure components and devices. A rack refers specifically to the frame that provides a structure for mounting the network equipment. A second line of security is typically the utilization of rack-mounted enclosures that restrict access to the network devices and their mounting points within the security enclosure. A third line of security is cabinets. Referring to FIG. 3, a cabinet 16 is a rack fitted with a door 18 and side panels 20. Cabinets secure the network devices by restricting access to every network device within the cabinet 16 when the door 18 is locked. Rack mounted enclosures and cabinets work well when the desire is to restrict access to all network devices within the enclosure or cabinet, and when there is sufficient space for the enclosure or cabinet within the installation area. However, in many instances restricting access to all network devices within a cabinet is not practical or required. For example, many potential service personnel from many different vendors may need access to the data center and the network equipment to conduct testing and provide repair services. Unlocking cabinet 16 to allow various service personnel to work on a single network device exposes all network devices within the cabinet to theft. Further, the addition of cabinets adds more complexity for such testing and repair service personnel in terms of limited access to the interior of the cabinet, which increases service times and costs. Further, the cost of the cabinets and the additional space requirements increases the overall cost of the installation. There are also cases within a cabinet or an enclosure where multiple user access is granted and there is a need to further secure certain high-value or high-risk components.

Accordingly, there is a need, among other needs, for an easy to use rack security enclosure that has relatively strong structural integrity, and is reconfigurable to meet the need of securing one or more rack mounted network devices and supporting multiple heights.

SUMMARY

The present disclosure generally provides exemplary embodiments of a security enclosure used for security purposes. More particularly, the present disclosure provides exemplary embodiments of a security enclosure that is reconfigurable or adjustable to protect one or more network devices. As noted above, examples of network devices include patch panels, switches, routers, servers and storage devices. In one embodiment, the security enclosure includes an adjustable enclosure body, and an adjustable locking cover operatively connected to the enclosure body. The adjustable cover is configured to move between closed position and open positions, and includes a lock assembly to lock the cover in the closed position. In another embodiment, the security enclosure includes a telescoping enclosure body for connection to a front face of the rack, and a telescoping cover operatively connected to the enclosure body and configured to move between a closed position and an open position. In another embodiment, the security enclosure includes a telescoping enclosure body for connection to a front face of the rack, and a telescoping cover operatively connected to the enclosure body and configured to move between a closed position and an open position. The cover also includes a lock assembly to lock the cover in the closed position.

BRIEF DESCRIPTION OF THE DRAWINGS

The figures depict embodiments for purposes of illustration only. One skilled in the art will readily recognize from the following description that alternative embodiments of the structures illustrated herein may be employed without departing from the principles described herein, wherein:

FIG. 9A is a front perspective view of the security enclosure of FIG. 4 in a retracted position, and illustrating the cover assembly in the open position;

DETAILED DESCRIPTION

The present disclosure generally provides exemplary embodiments of a security enclosure used for securing network devices. More particularly, the present disclosure provides exemplary embodiments of a security enclosure that is reconfigurable or adjustable to protect one or more network devices, e.g., rack mounted network devices. It should be noted, that while the embodiments disclosed herein relate to a rack mounted security enclosures, those skilled in the art would recognize that the adjustable security enclosure contemplated by the present disclosure includes other enclosure types, for example, free standing enclosures or other mounting type enclosures. As noted above, examples of network devices include patch panels, switches, routers, servers and storage devices.

Figure 1:
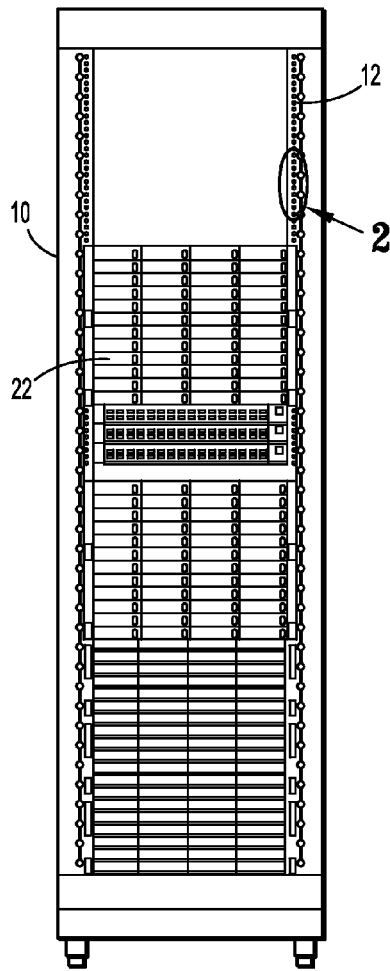
FIG. 1 is a front plan view of a rack used to house network devices.
Figure 2:
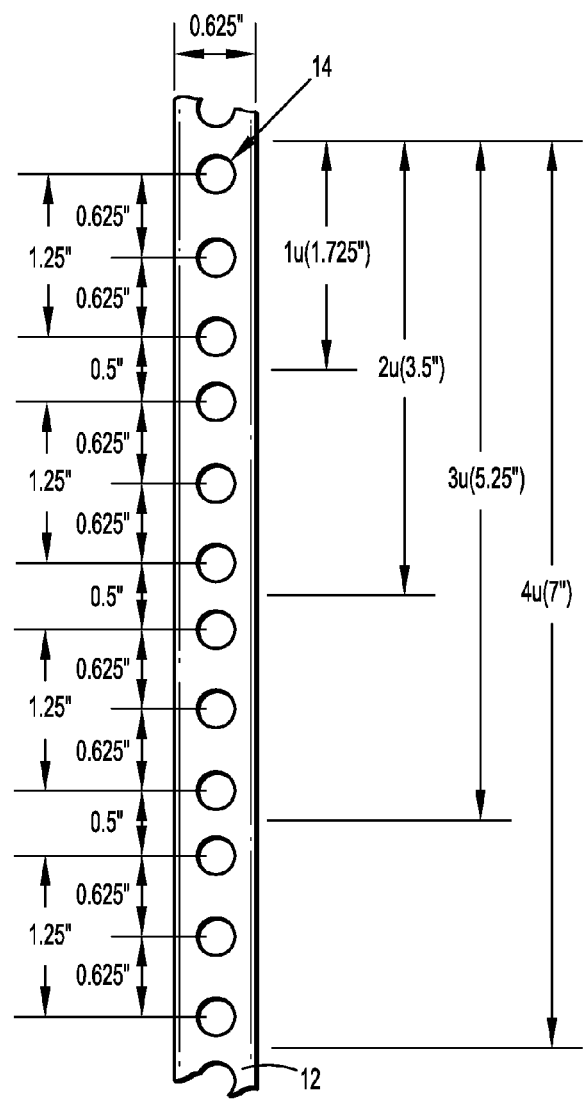
FIG. 2 is an exploded view of a portion of the rack of FIG. 1, illustrating a portion of a front surface of the rack with tapped holes.
Figure 3:
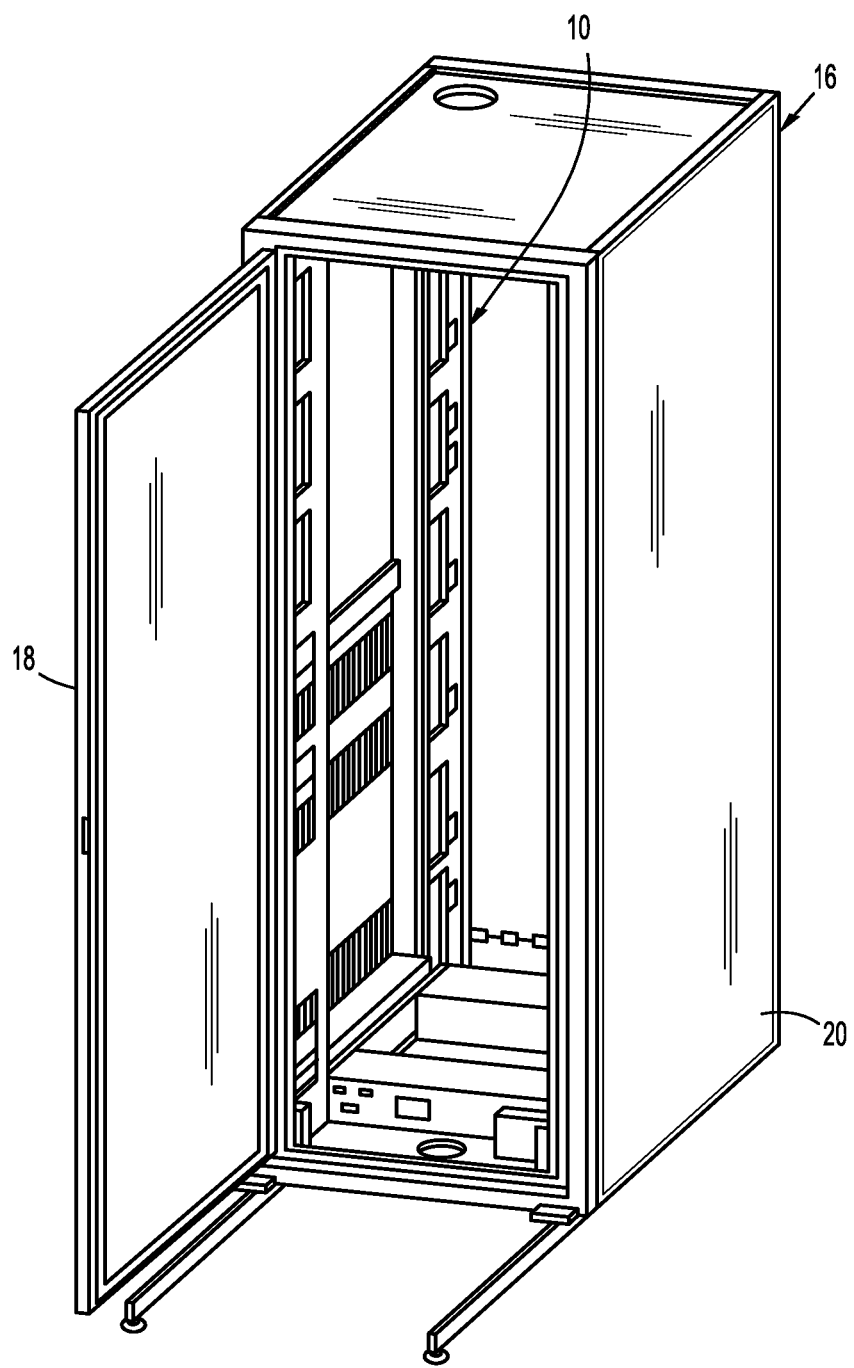
FIG. 3 is a perspective view of a cabinet used to house network devices.
Figure 4A:
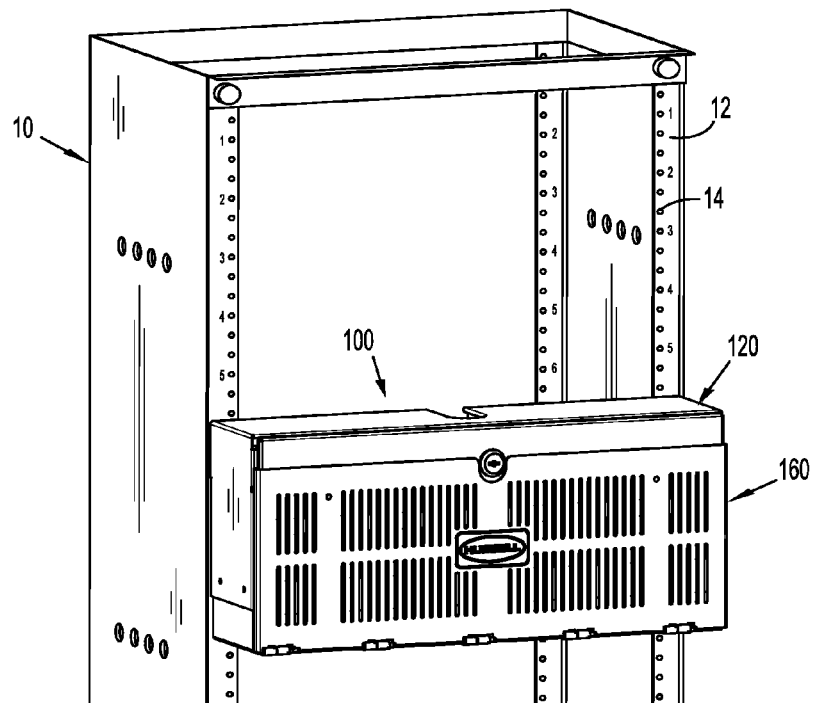
FIG. 4A is a front perspective view of an exemplary embodiment of a security enclosure according to the present disclosure installed on a rack and in a retracted position.
Figure 4B:
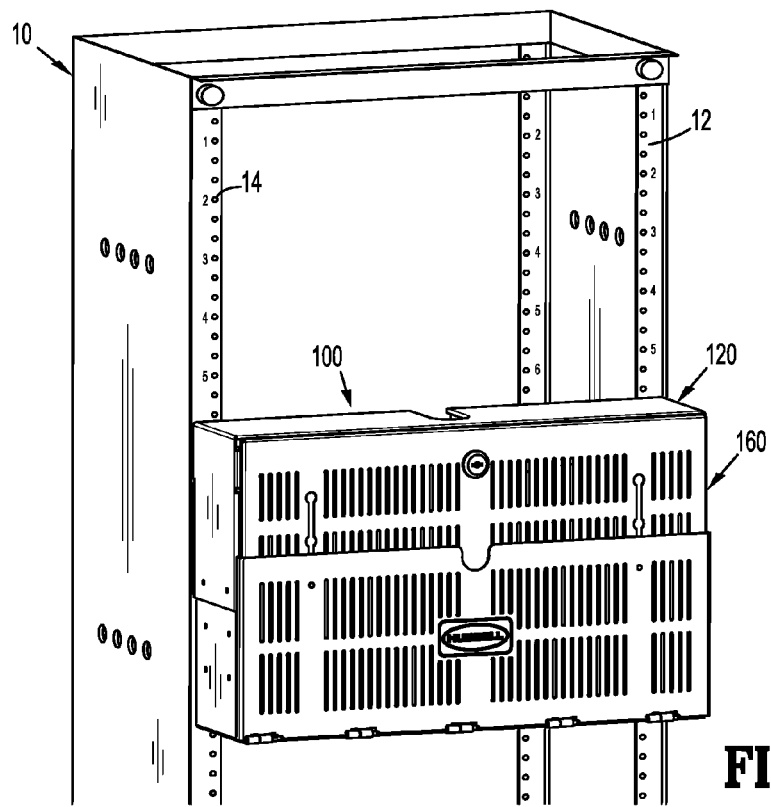
FIG. 4B is a front perspective view of an exemplary embodiment of a security enclosure according to the present disclosure installed on a rack and in an extended position.

Referring to FIG. 4, in an exemplary embodiment the security enclosure 100 includes an enclosure body 120 and a cover assembly 160. The security enclosure 100 is configured and dimensioned to mount to a rack 10, where the enclosure body 120 and cover assembly 160 are constructed so that they can telescope between an "XU" enclosure height and an "YU" enclosure height, where "X" can be any number of rack units, and "Y" can be any number of rack units greater than "XU", or cover the entire rack height. A general rule for determining the telescoping height of the security enclosure is 2N−1 to 2N−2, where N is the number of the rack units (U) covered in the compressed configuration. To illustrate, in one example, the enclosure body 120 and locking cover assembly 160 can be configured so that they can telescope between a 2U enclosure height and a 3U enclosure height. In another example, the enclosure body 120 and locking cover assembly 160 can be configured so that they can telescope between a 4U enclosure height and a 6U enclosure height, shown in FIGS. 4A and 4B. In another example, the enclosure body 120 and locking cover assembly 160 can be configured so that they can telescope between a 7U enclosure height and a 12U enclosure height, shown in FIG. 12.

The enclosure body 120 can be mounted under, over or around the one or more rack mounted network devices using, for example, fasteners screwed into the tapped holes 14 in the face 12 of the rack 10. The cover assembly 160 has a lockable cover that is intended to cover one or more rack mounted network devices and their mounting points, including mounting hardware used to secure such network devices to the rack, so as to protect the network devices from tampering, sabotage, theft or other action that can cause disruption to the data center network. The cover assembly 160 restricts access to the security enclosure's mounting points so that the security enclosure 100 and/or cover assembly 160 cannot be removed from the rack. The depth of the security enclosure 100 used for a particular rack can vary depending upon a number of factors, including the amount of available space in the room where the rack is located, the type of network devices installed in the rack, and whether the device has data or power cord connections on the front face. As an example, the depth of the security enclosure 100 may range from between about 3 inches and about 15 inches.

The security enclosure 100 according to the present disclosure, i.e., the enclosure body 120 and the locking cover assembly 160, can be constructed of a rigid material sufficient to provide security for the rack mounted network devices. For example, the security enclosure can be fabricated from steel, such as powder coated steel, galvanized steel, chromed or other coated steel, stainless steel, aluminum, rigid plastic, carbon fiber materials or other similar rigid materials and/or combinations of such materials.

Figure 5A:
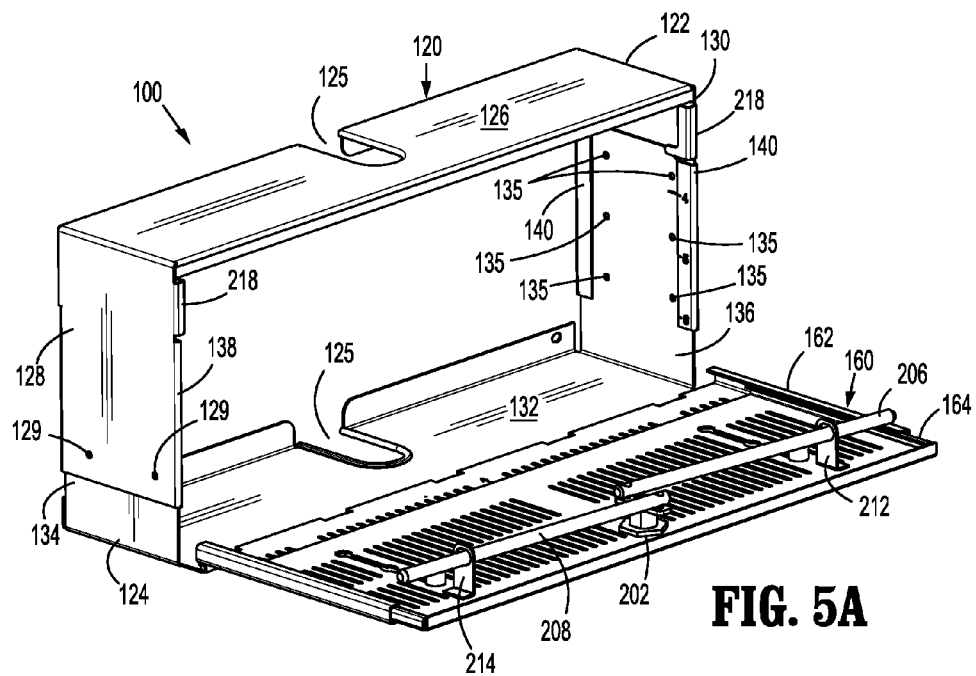
FIG. 5A is a perspective view of the security enclosure of FIG. 4, illustrating the security enclosure in a retracted position and a cover assembly in an open position.
Figure 5B:
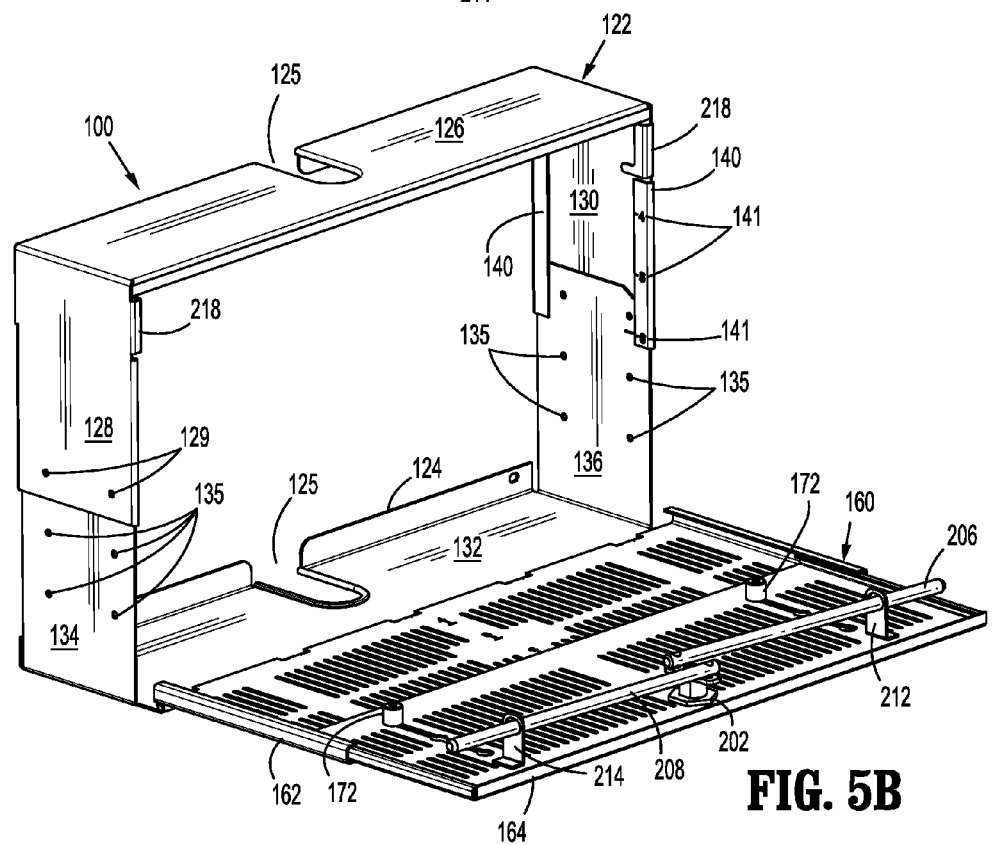
FIG. 5B is a perspective view of the security enclosure of FIG. 4, illustrating the security enclosure in an extended position and the cover assembly in the open position.
Figure 6A:
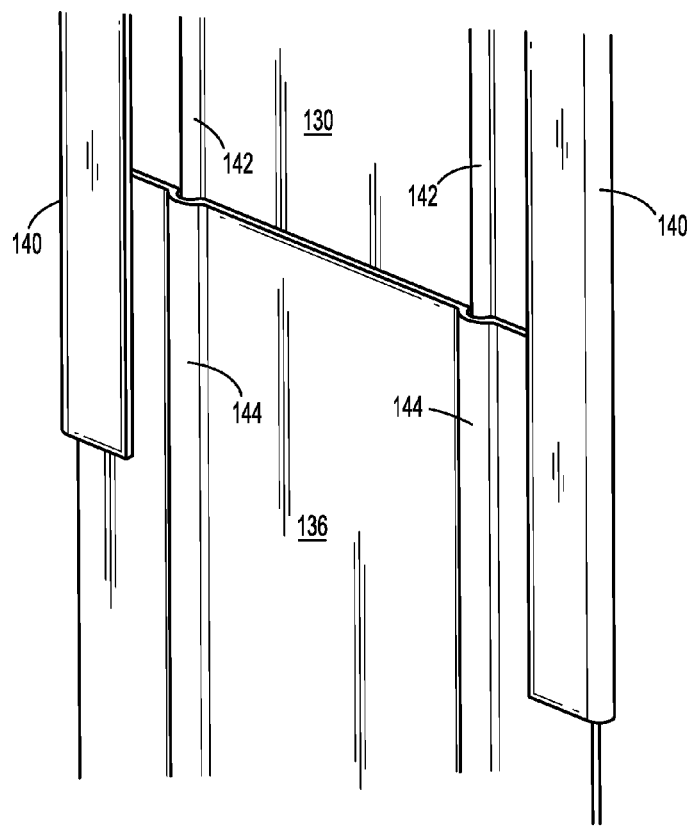
FIG. 6A is a perspective view of a portion of the security enclosure of FIG. 5, illustrating the walls of the enclosure in an extended position and a foldover component of the security enclosure walls.
Figure 6B:
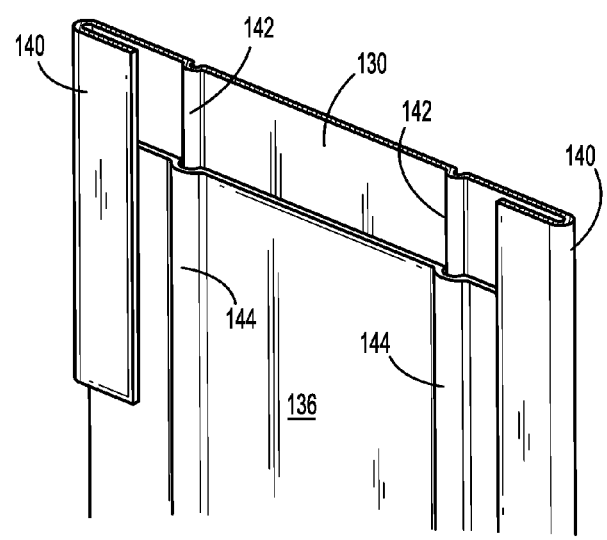
FIG. 6B is a perspective view of a portion of the security enclosure of FIG. 5, illustrating the walls of the enclosure in a retracted position and the foldover component of the security enclosure walls.

Referring to FIGS. 5 and 6, the enclosure body 120 has an upper body section 122 and a lower body section 124. The upper body section 122 in this exemplary embodiment has a top wall 126 and a pair of side walls 128 and 130. The lower body section 124 has a bottom wall 132 and a pair of side walls 134 and 136. The side walls of the upper and lower body sections 122, 124 are interlocked so that the sections are in a telescoping arrangement. More particularly, the left side wall 128 of upper body section 122 has hems 138, and left side wall 134 of the lower body section 124 slides within the hems 138. In addition, the right side wall 130 of upper body section 122 has a hems 140, and right side wall 136 of the lower body section 124 slides within the hems 140. In this arrangement, the two body sections can slide relative to each other (i.e., telescope) to retract or expand the height dimension of the security enclosure 100. To assist in guiding the side walls relative to each other and to provide additional enclosure stability, the upper body section side walls may include a pair of rails 142 and the lower body section side walls include a pair of guides 144 that are aligned with a respective rail, such that one rail 142 glides within one guide 144, as seen in FIGS. 6A and 6B.

In another embodiment, the hems 138 and 140 may be located on side walls 134 and 136 instead of side walls 128 and 130. Further, while the hems 138 are shown in the figures as being on the same side wall 128, one skilled in the art would readily recognize that one hem 138 can be located on side wall 128 and the other hem 138 can be located on the opposite side of side wall 134. Similarly, while the hems 140 are shown in the figures as being on the same side wall 130, one skilled in the art would readily recognize that one hem 140 can be located on side wall 130 and the other hem 140 can be located on the opposite side of side wall 136. In addition, while the present disclosure provides hems 138, 140 to facilitate adjustment of the enclosure body 120 e.g., the telescopic movement of the enclosure body, to the desired rack unit height, one skilled in the art would readily recognize that other structures and/or components may be employed to facilitate adjustment of the enclosure body 120. For example, the side walls of the upper and lower body sections of the enclosure body may employ one or more mechanical slides, such as rail guides or linear bearing slides, to facilitate the telescopic movement of the enclosure body 120.

Figure 7A:
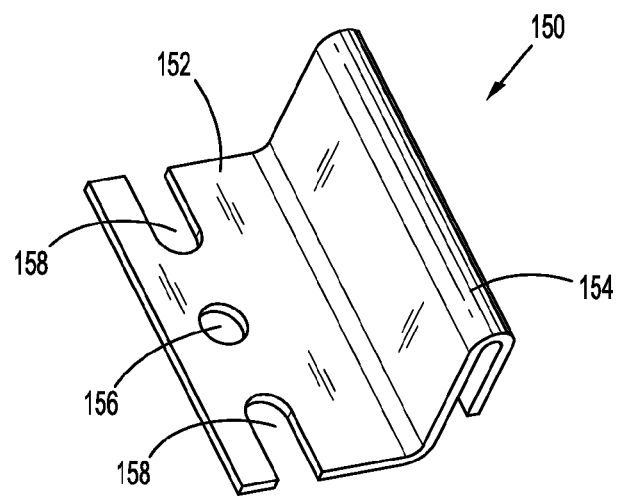
FIG. 7A is a perspective view of a locking clip for use with the security enclosure of the present disclosure.
Figure 7B:
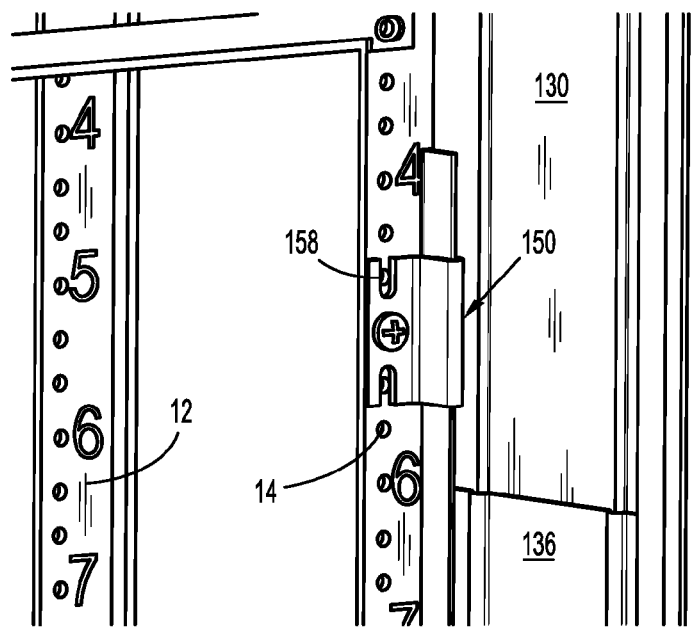
FIG. 7B is a perspective view of a portion of the security enclosure of FIG. 5, illustrating the locking clip of FIG. 7A coupled to the security enclosure and secured to a rack.

As the security enclosure 100 is expanded to a wider opening, such as when the security enclosure is extended to an 8U, 9U, 10U, 11U or 12U position, it may be desirable to provide reinforcement to stabilize the side walls and further lock the side walls to the rack 10. Referring to FIG. 7A, an exemplary embodiment of a locking clip 150 for use in stabilizing the side walls is shown. The locking clip 150 has a base 152 and a hem 154 extending from the base 152. The base 152 has a mounting hole 156 and mounting slots 158 that can be used to secure the locking clip 150 to a rack. The slots 158 in the base 152 further allow the locking clip 150 to span different rack units while still providing access to tapped mounting holes 14. The hem 154 extending from the base 152 is configured to be inserted into a hem 138 or 140 of the side walls of the upper and/or lower body sections 122, 124 of the enclosure body 120. The length of the fold-over of the hem 154 allows the locking clip 150 to move freely along the hem 138 or 140 on the enclosure body walls. As shown in FIG. 7B, the hem 154 of locking clip 150 is positioned into the hem 140 in side wall 136 of lower body section 124 preferably at a point in close proximity to a mid-point of the overlapped side walls 130 and 136. The base 152 of the locking clip 150 is then secured to the rack 10. By placing the hem 154 of locking clip 150 into the hem 140 of a side wall of the enclosure body, the hem 154 creates a friction fit between the locking clip 150 and the side walls (e.g., side walls 130 and 136) and thus increase the stability of the enclosure body side walls. Further, by positioning the locking clip 150 at a point in close proximity to the mid-point of the enclosure body side walls, the locking clip 150 can provide stability to a midpoint of the side walls. The locking clips are preferably positioned on both sides of the security enclosure 100, such that a locking clip 150 reinforces side walls 128, 134, and another locking clip reinforces side walls 130, 136. While the locking clips are shown as positioned at a mid-point of the enclosure body side walls, one skilled in the art would readily recognize that the locking clips can be positioned at any point along the enclosure body side walls, and that a plurality of locking clips can be positioned on each side wall as described above.

Continuing to refer to FIGS. 5A and 5B, one or both of the hems 138 and 140 closest to locking cover assembly 120 may also include a sequence of numbers 141 associated with the rack unit size of the security enclosure 100. The number sequence facilitates easier installation of the security enclosure such that the installer can evenly adjust the height of the enclosure body 120 using the number sequence as a guide. To illustrate, the enclosure body 120 and locking cover assembly 160 are constructed so that they can telescope between a 4U enclosure height and a 6U enclosure height, as seen in FIGS. 5A and 5B. Thus, the sequence of numbers is "4", "5" and "6" representing each rack unit size of the security enclosure 100. After adjusting the enclosure body to the desired rack unit height using, for example, the numbering sequence as a guide, a pin or clip can be inserted through alignment holes 129 in side walls 128, 130 into a corresponding set of alignment holes 135 in side walls 134, 136 to hold, lock or secure the enclosure body 120 at the desired rack unit height until the enclosure body is mounted to the rack 10 using, for example, fasteners through mounting hole 148. One skilled in the art would readily recognize that the structures and/or components employed to facilitate adjustment of the enclosure body, e.g., the telescopic movement of the enclosure body, may permit the use of other mechanisms to hold, lock or secure the enclosure body 120 at the desired rack unit height until the enclosure body is mounted to the rack 10. For example, if one or more rail guides are used to facilitate the adjustment of the enclosure body, then a set screw may be used to lock the rail guide in position.

Referring again to FIGS. 5A and 5B, both the top wall 126 of the upper body section 122 and the bottom wall 132 of the lower body section 124 have one or more openings 125 to allow cabling associated with the rack mounted network devices to pass through the security enclosure. The upper body section side wall 128 and the lower body section side wall 134 may also include one or more openings, similar to opening 125, that can be aligned when telescoping the security enclosure to allow cabling associated with the network devices to pass through that side of the security enclosure 100. Similarly, the upper body section side wall 130 and the lower body section side wall 136 may include one or more openings, similar to opening 125, that can be aligned when telescoping the security enclosure to allow cabling associated with the network devices to pass through that side of the security enclosure 100.

Figure 8A:
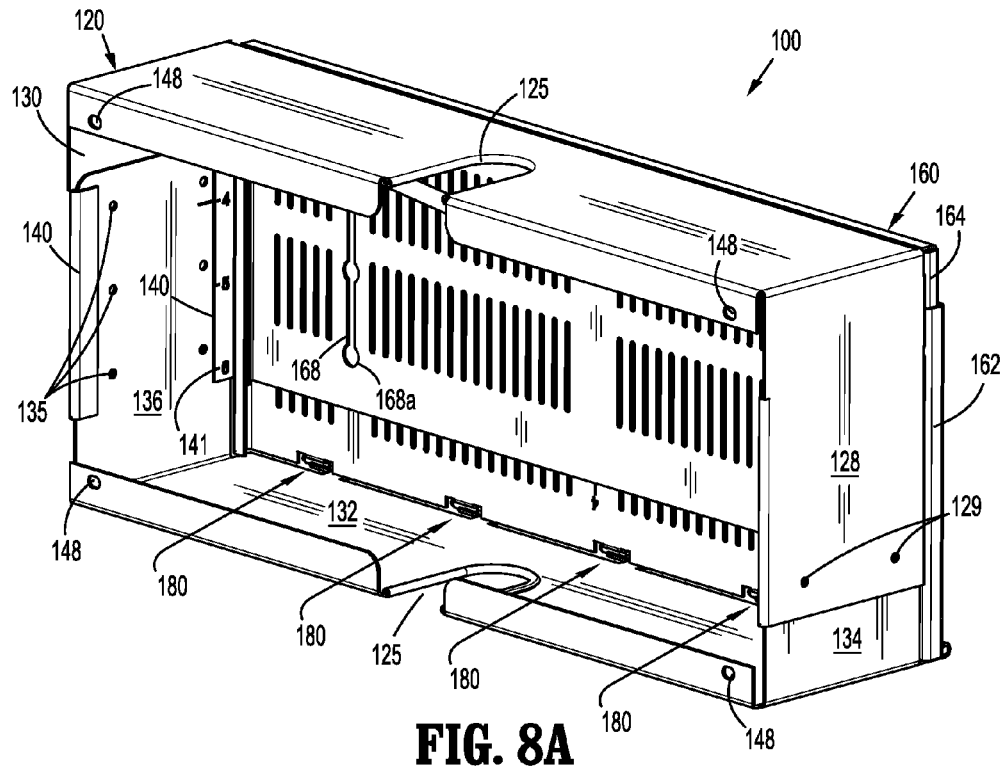
FIG. 8A is a rear perspective view of the security enclosure of FIG. 4 in a retracted position.
Figure 8B:
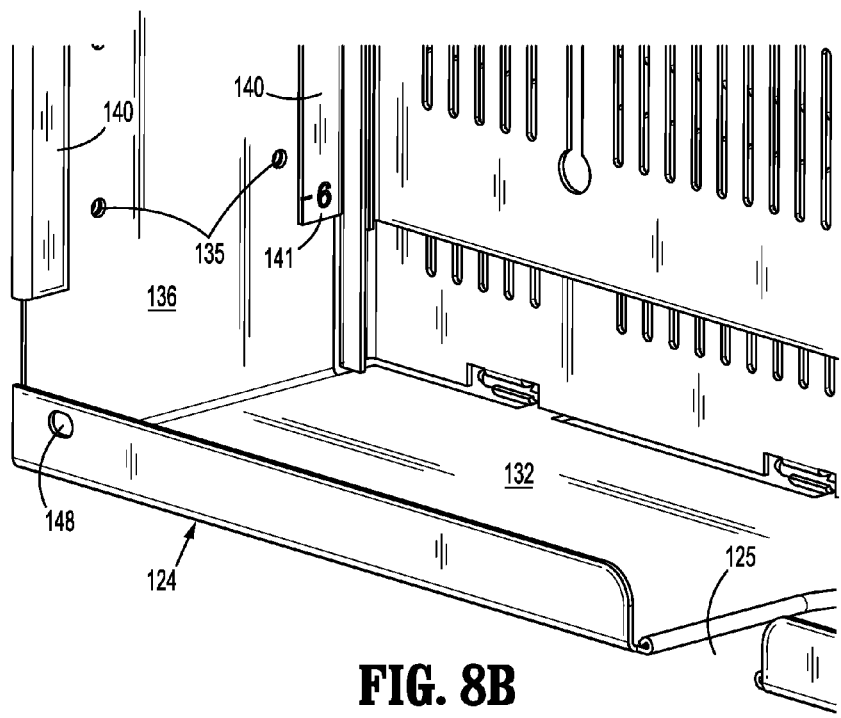
FIG. 8B is a rear perspective view of a portion of the security enclosure of FIG. 8A, illustrating rack unit alignment numbering.

Referring now to FIGS. 8A and 8B, in the rear of the enclosure body 120 are mounting holes 148 for securing the security enclosure 100 to a rack using fasteners. The fasteners can be any conventional fastener capable of securing the security enclosure to a rack. Examples of such fasteners include machine screw or threaded bolt, threaded into tapped holes 14 in the face 12 of the rack 10.

Turing to FIGS. 9-11, an exemplary embodiment of a locking cover assembly 160 according to the present disclosure will now be described. In this exemplary embodiment, the locking cover assembly 160 includes a lower cover section 162 and an upper cover section 164. The lower cover section has sides 162a and 162b with a hem that forms a channel to receive the sides 164a and 164b of the upper cover section 164. The hemmed sides 162a and 162b interlock the two cover sections and permit the lower and upper cover sections to move relative to each other. Preferably, the sides 164a and 164b of upper cover section 164 have a hem as well, as seen in FIGS. 10A and 10B. In addition, the sides 164a and 164b of upper cover section 164 may have a protective cover, such as a plastic guard, that limits friction between the side walls as they move relative to each other. While the present disclosure provides hemmed sides to interlock the two cover sections and facilitate adjustment of the cover section 160 e.g., the telescoping movement of the cover assembly, to the desired rack unit height, one skilled in the art would readily recognize that other structures and/or components may be employed to facilitate adjustment of the cover assembly 160. For example, the upper and lower cover sections of the cover assembly may employ one or more mechanical slides, such as rail guides or linear bearing slides, to facilitate the telescopic movement of the cover assembly 160.

Figure 10A:
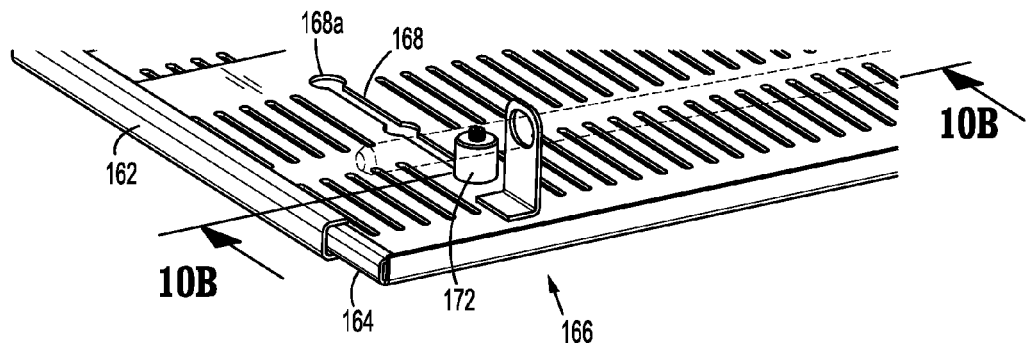
FIG. 10A is a perspective view of a portion of the cover assembly of FIG. 9A, illustrating a cover interlock and interlocked cover sections.
Figure 10B:
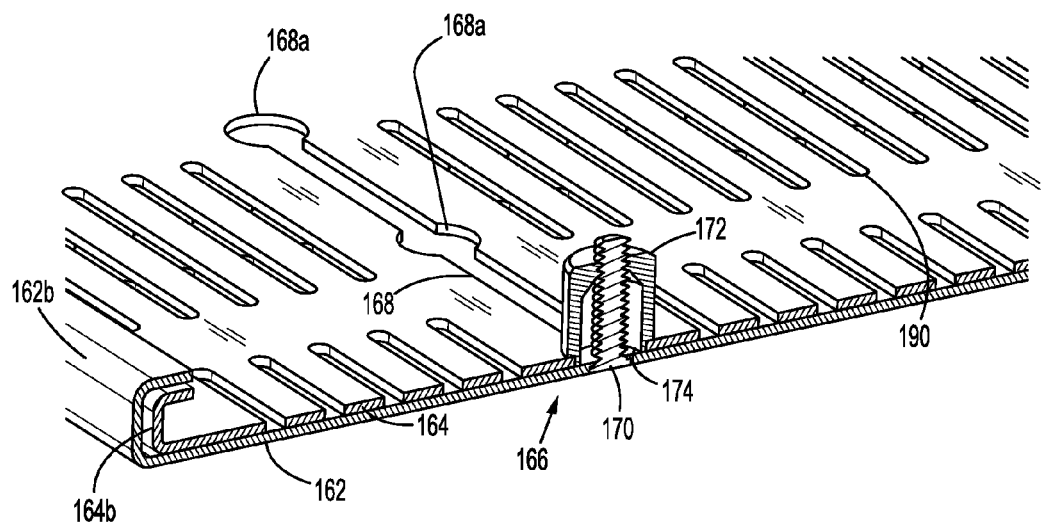
FIG. 10B is a perspective view in partial cross section taken along line 10B-10B of FIG. 10A.
Figure 11A:
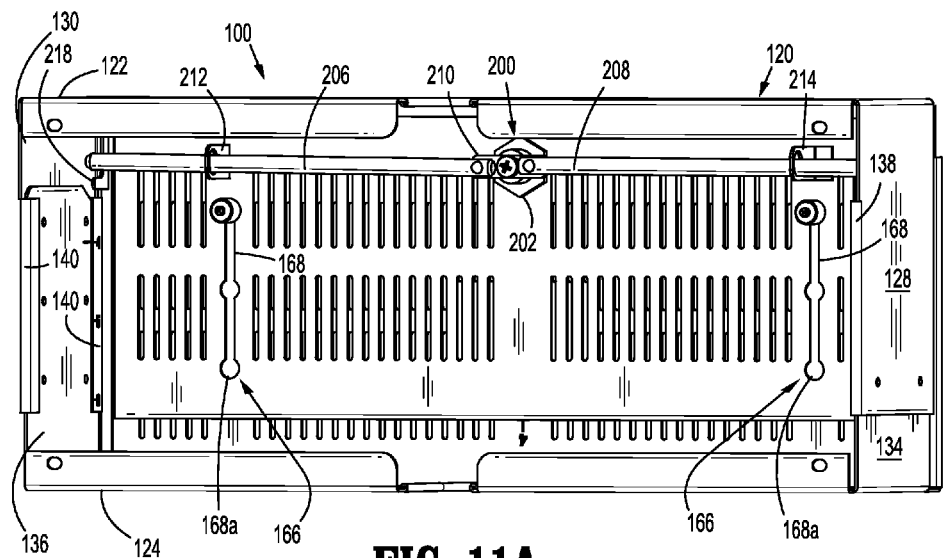
FIG. 11A is a rear perspective view of the security enclosure of FIG. 4, illustrating a cover lock assembly in a locked position.
Figure 11B:
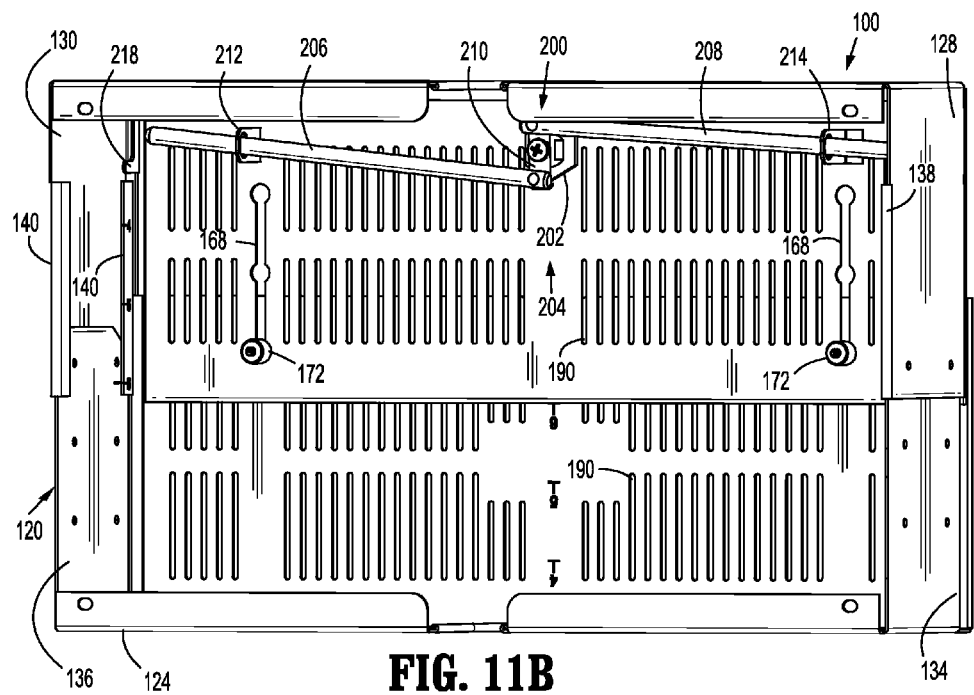
FIG. 11B is a rear perspective view of the security enclosure of FIG. 4, illustrating the cover lock assembly in an unlocked position.

In the exemplary embodiment shown, the cover sections 162, 164 include one or more cover interlocks 166 used to releasably secure the two cover sections to each other when fastened together and to permit the telescopic movement of the locking cover assembly 160 when released. In an exemplary embodiment shown in FIGS. 9 and 10, two cover interlocks 166 are provided. Each cover interlock 166 includes an elongated slot 168 in one cover section, a fastener 170, and a threaded nut 172. The elongated slot 168 includes one or more guide openings 168a used to align the height of the cover assembly 160 with the height of the enclosure body 120. To illustrate, the enclosure body 120 and cover assembly 160 of the embodiment of FIGS. 9 and 10 are constructed so that they can telescope between a 4U enclosure height and a 6U enclosure height. The guide openings 168a in the upper cover section 164 are aligned with the 4U, 5U and 6U security enclosure heights so that when the cover assembly 160 is locked to the enclosure body 120, the cover assembly is aligned with the enclosure body. In addition, the inside of the lower cover section 162 may include a sequence of numbers 176 (seen also in FIG. 11B) associated with the rack unit size of the security enclosure 100. The number sequence facilitates easier installation of the security enclosure such that the installer can evenly adjust the height of the cover assembly 160 using the number sequence as a guide. To illustrate, the enclosure body 120 and locking cover assembly 160 are constructed so that they can telescope between a 4U enclosure height and a 6U enclosure height, as seen in FIGS. 11A and 11B. Thus, the sequence of numbers is "4", "5" and "6" representing each rack unit size of the security enclosure 100.

The fastener 170 is preferably a threaded bolt secured to the other cover section, here lower cover section 162, and is positioned on the lower cover plate 162 such that the fastener 170 can slide within elongated slot 168, seen in FIGS. 10A and 10B. The threaded nut 172 is preferably a thumb nut screw configured to mate with the fastener 170. The threaded nut 172 can be tightened to secure the cover sections 162, 164 in place once the cover assembly 160 is extended to a desired rack unit height. The threaded nut 172 has an extension 174 on one side that is configured to fit within the guide opening 168a in the elongated slot 168. When the threaded nut 172 is threaded onto the fastener 170, the extension 174 engages and fits within the guide opening 168a of elongated slot 168 to lock the position of the cover assembly 160. It should be noted that the disclosure provides cover interlocks that include an elongated slot 168 in one cover section, a fastener 170 secured to the other cover section, and a threaded nut 172, however, one skilled in the art would readily recognize that other cover interlocks may be used that provide the telescoping movement of the cover assembly when released, and the securing of the two cover sections together when the cover assembly height is extended to a desired rack unit height.

Figure 9B:
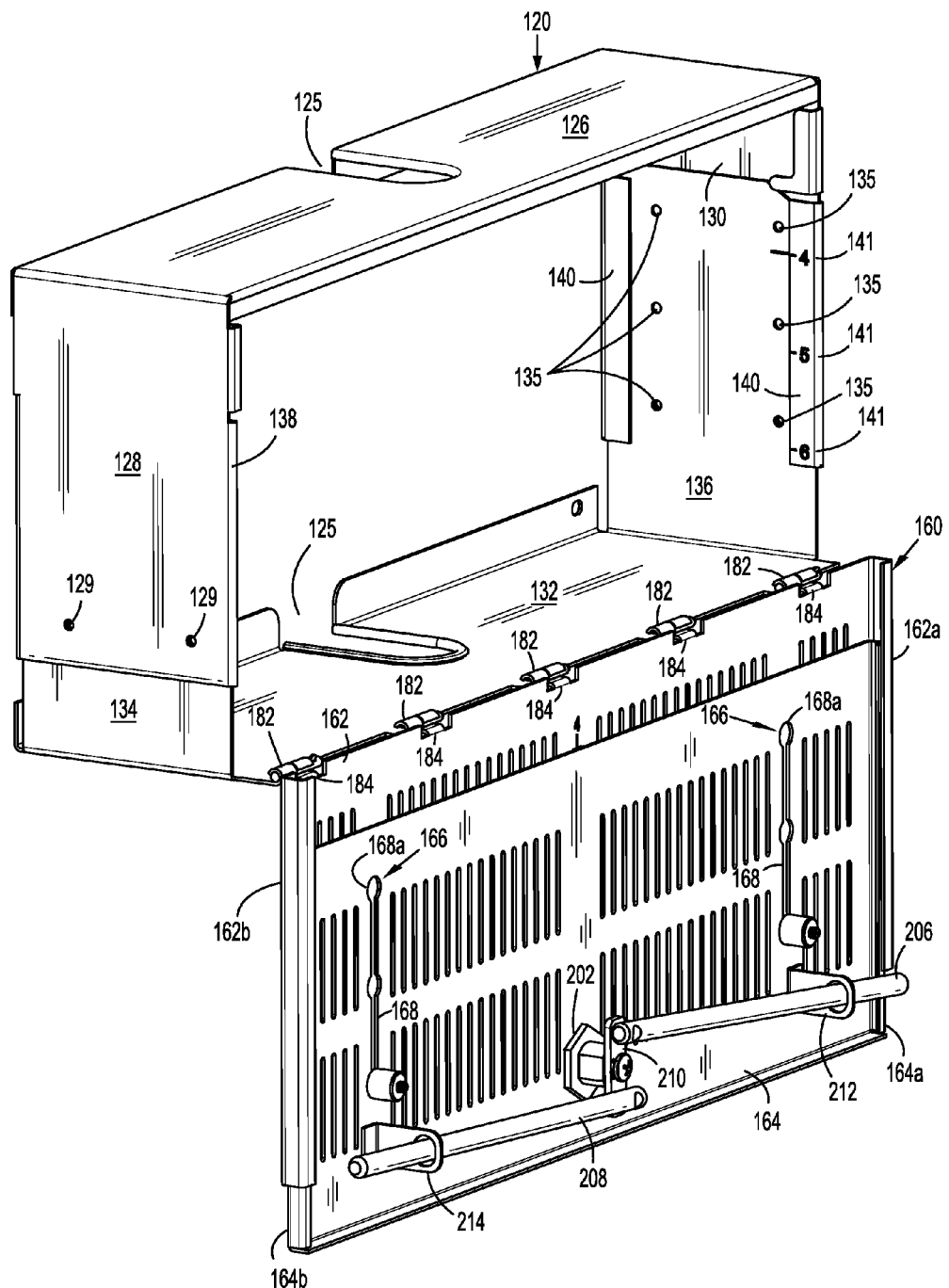
FIG. 9B is a front left perspective view of the security enclosure of FIG. 4 in an retracted position, and illustrating the cover assembly in the open position.
Figure 9C:
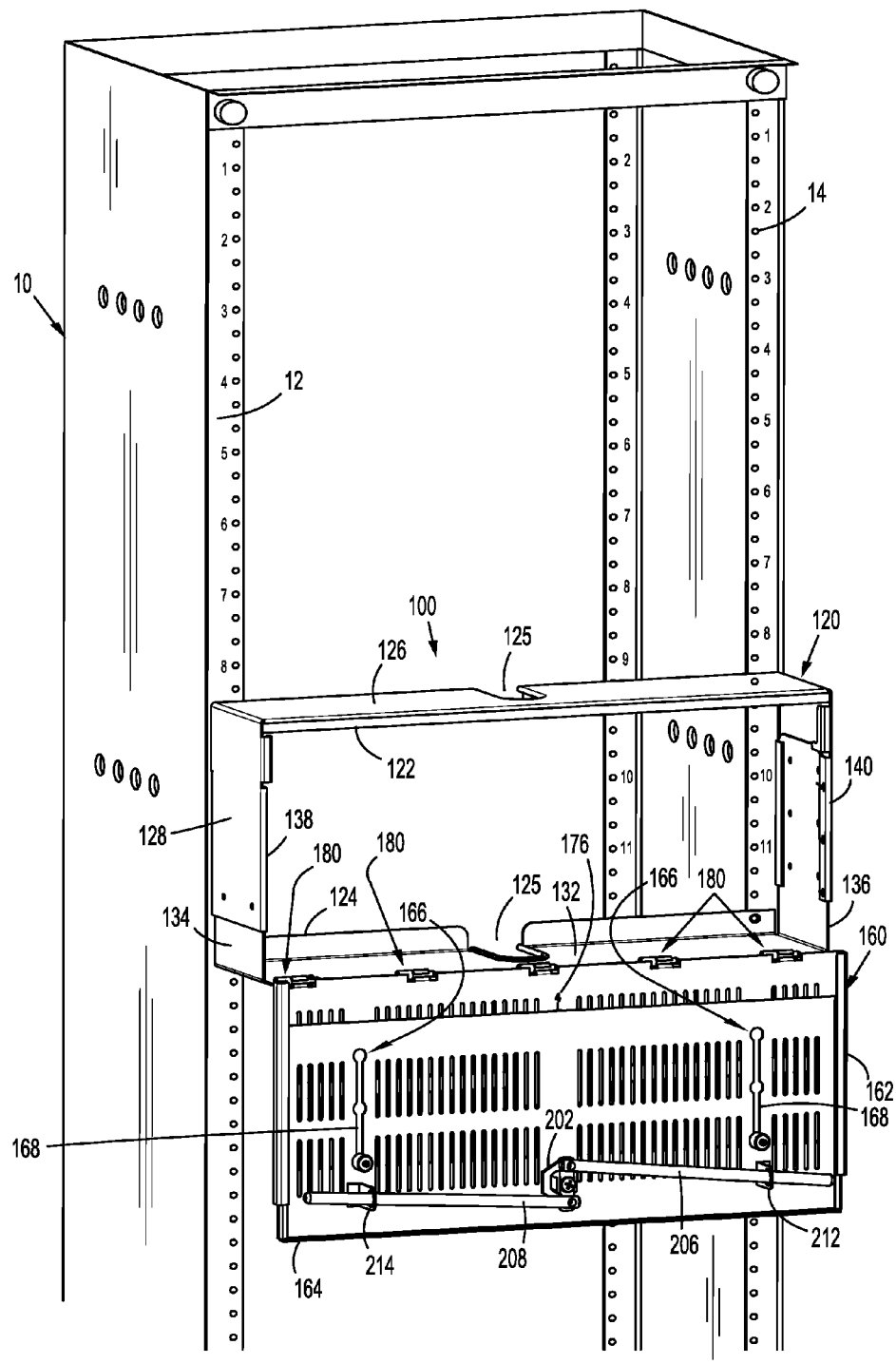
FIG. 9C is a front perspective view of the security enclosure of FIG. 4 secured to a rack, and illustrating the cover assembly in the open position.

Referring to FIG. 9, the cover assembly 160 is pivotally secured to the enclosure body 120 using one or more hinge assemblies 180. In the embodiment shown in FIG. 9, each hinge assembly include a body hinge portion 182 and a cover hinge portion 184 that are configured to be releasably coupled to each other so that a service technician can easily separate the cover assembly 160 from the enclosure body 120 when servicing network devices protected by the security enclosure 100. Hinges that can be easily separated are known in the art. In another embodiment shown in FIG. 12, the hinge assembly is a single hinge 186, such as a piano hinge, that pivotally secures the cover assembly 160 to the enclosure body 120. It should be noted that the security enclosure shown in FIG. 12 is a 7U-12U enclosure, where the enclosure body 120 and locking cover assembly 160 can be configured so that they can telescope between a 7U enclosure height and a 12U enclosure height.

Referring to FIGS. 11A and 11B, the lower and upper cover sections 162, 164 of the cover assembly 160 also includes one or more vents 190 to permit air to flow through the cover assembly 160 and assist in controlling the temperature of network devices mounted to the rack and protected by the security enclosure 100. Preferably, the vents 190 on the lower cover section 162 are longer are then the vents 190 on the upper cover section 162 so that when the cover assembly height is adjusted, the vents 190 are not blocked from permitting air to flow through the security enclosure 100.

Continuing to refer to FIGS. 11A and 11B, the upper cover section 164 also includes a lock assembly 200 used to latch the cover assembly 160 to the enclosure body 120 and prevent access to the network devices within the security enclosure. The lock assembly 200 can be any conventional keyed lock assembly or other conventional type of lock assembly. In the embodiment of FIGS. 11A and 11B, the lock assembly 200 includes a lock cylinder 202 and a latch assembly 204. The lock cylinder 202 is secured to the upper cover section 164, as shown in FIG. 11A. The latch assembly 204 includes latch arms 206, 208, a pivot arm 210 and arm guides 212, 214. The arm guides 212, 214 are secured to the inside of the upper cover section 164 so that they are aligned with a center line of the lock cylinder 202. The pivot arm 210 is secured to the lock cylinder 202 so that it is substantially perpendicular to a longitudinal axis of the upper cover section 164 when the lock assembly is in an open position, shown in FIG. 11B. Latch arm 206 extends through arm guide 212 and has one side connected to a pivot arm 210, and latch arm 208 extends through arm guide 214 and has one side connected to a pivot arm 210. In this configuration, when the lock cylinder 202 is rotated the lock assembly 200 can move between the open position where the latch arms 206, 208 are not engaged with the enclosure body 120 (seen in FIG. 11B), and a locked position where the latch arms 206, 208 are positioned to engage locking brackets 218 on the enclosure body 120 (seen in FIG. 11A) to prevent the pivoting of the cover assembly 160 to the open position. Describing the locking action of the lock assembly 200, when the lock assembly is in the open position, seen in FIG. 11B, and the lock cylinder 192 is rotated, the pivot arm 210 rotates causing the latch arms 206, 208 to move towards the respective sides 128 and 130 of the upper body section 122 of the enclosure body 120 until the latch arms 206, 208 are positioned behind locking brackets 218 on enclosure body 120, as seen in FIG. 11A.

Figure 12A:
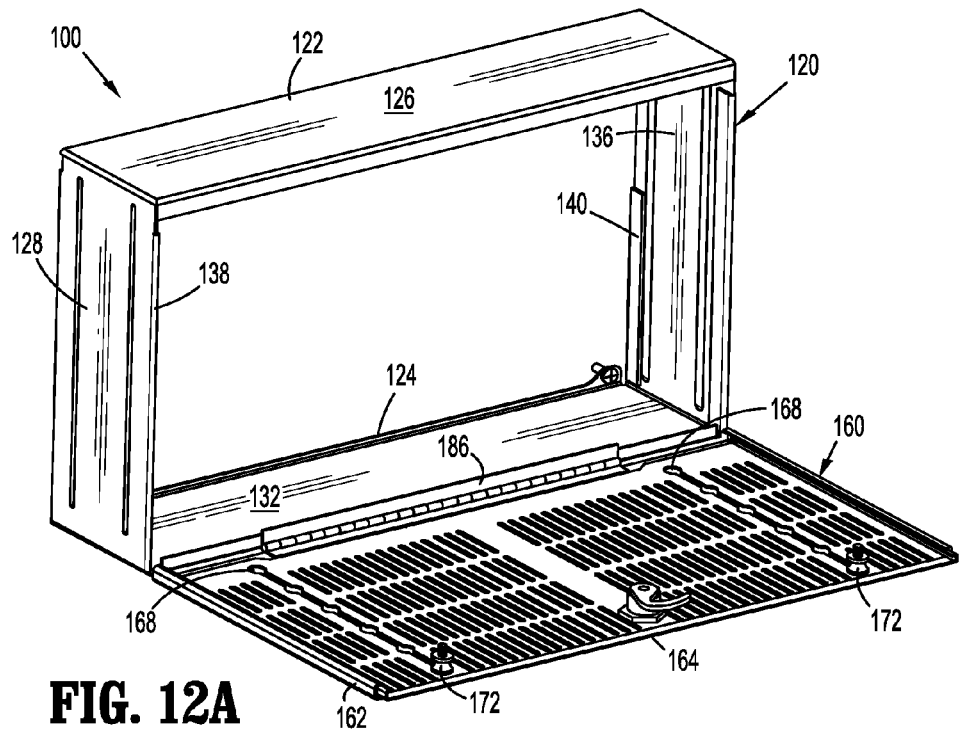
FIG. 12A is a front perspective view of another exemplary embodiment of a security enclosure according to the present disclosure, and illustrating the security enclosure in a retracted position and a single hinge securing the cover assembly to the enclosure body.
Figure 12B:
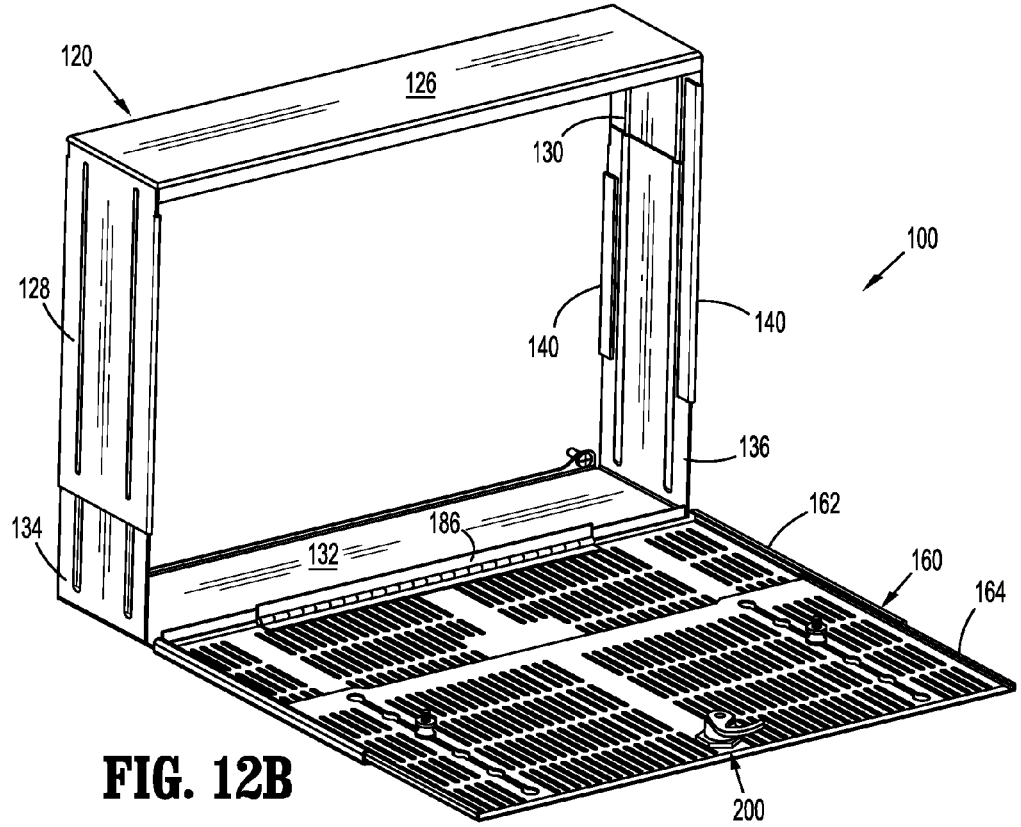
FIG. 12B is a front perspective view of the security enclosure of FIG. 12A, illustrating the security enclosure in an extended position and a single hinge securing the cover assembly to enclosure body.
Figure 12C:
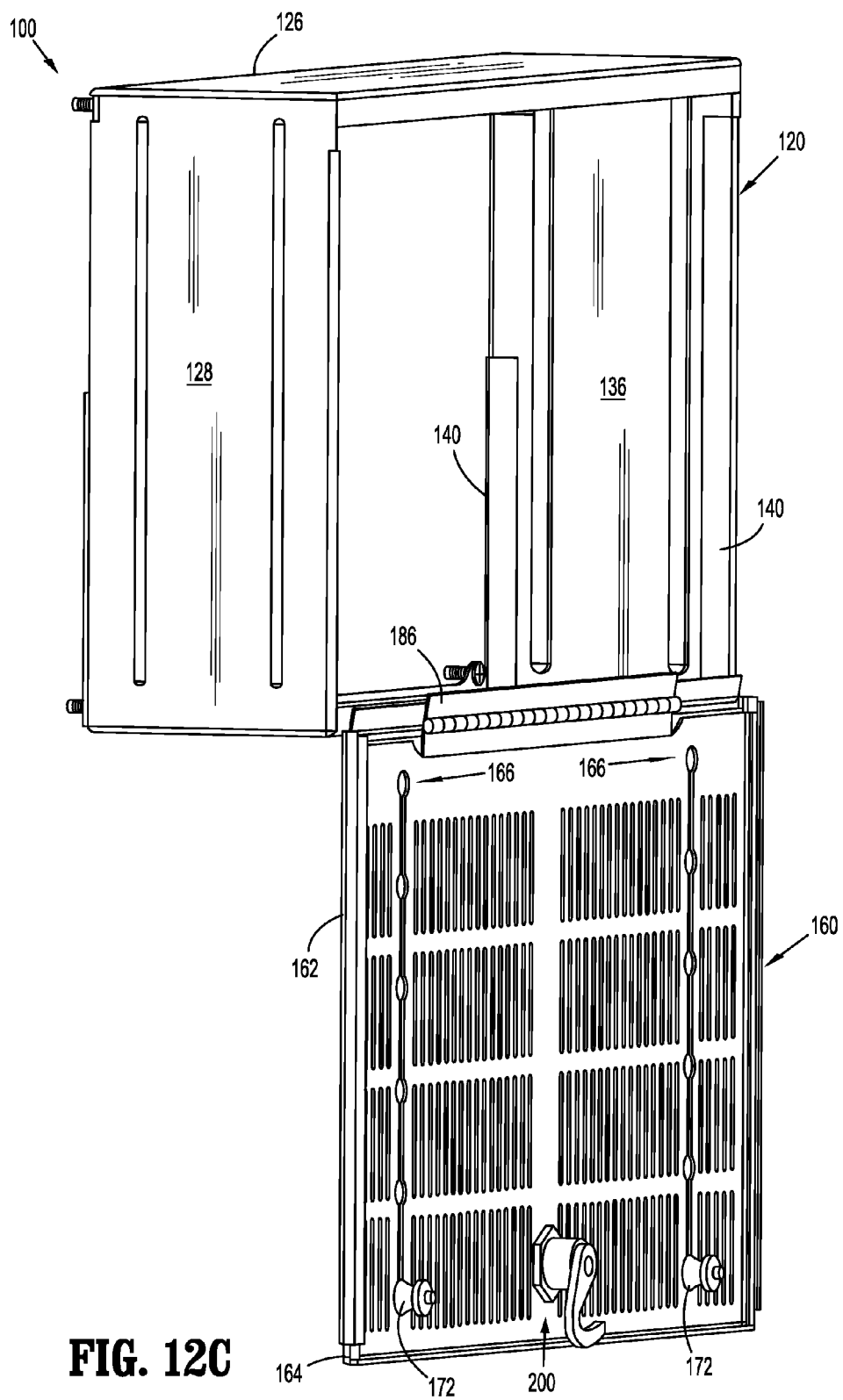
FIG. 12C is a side perspective view of the security enclosure of FIG. 12A, illustrating the security enclosure in an extended position and a single hinge securing the cover assembly to enclosure body.
Figure 13A:
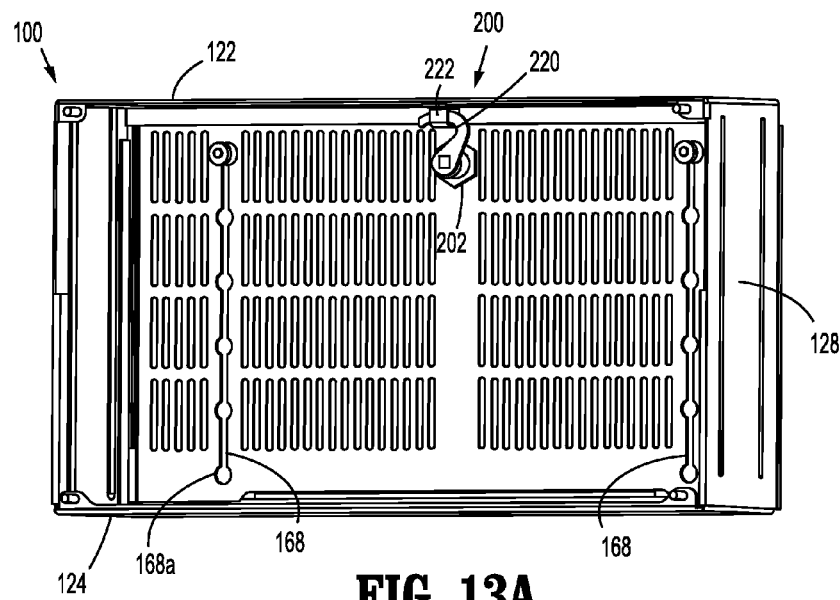
FIG. 13A is a rear perspective view of the security enclosure of FIG. 12 in a retracted position, and illustrating an another embodiment of a lock assembly.
Figure 13B:
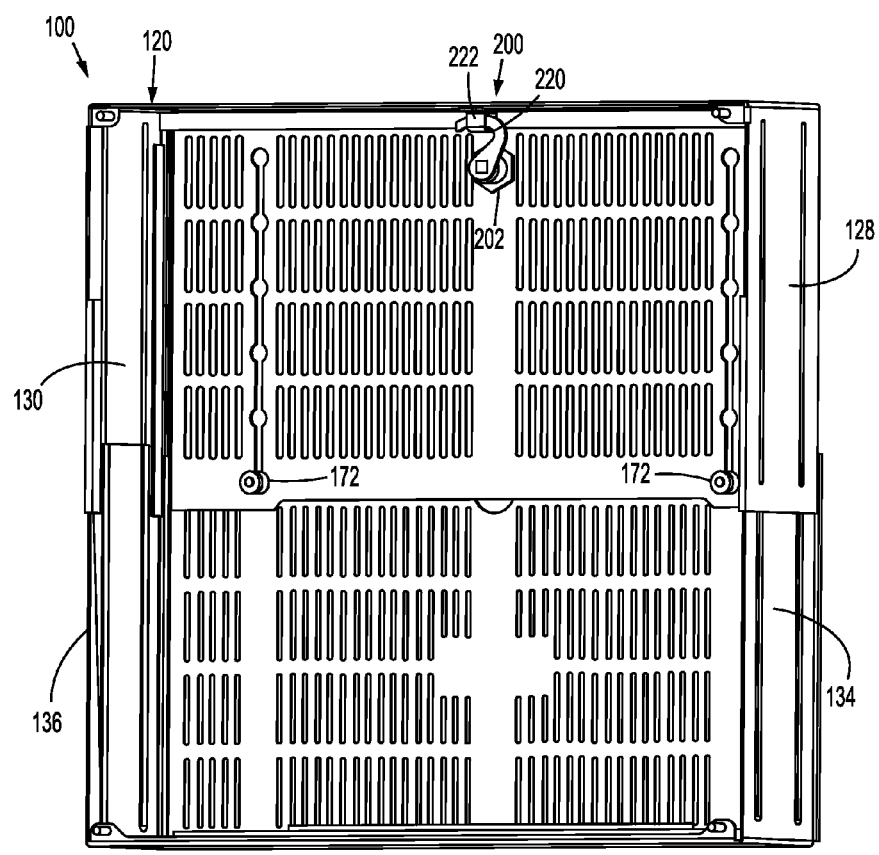
FIG. 13B is a rear perspective view of the security enclosure of FIG. 12 in an extended position, and illustrating the lock assembly of FIG. 13A.

Referring to FIGS. 12 and 13, another embodiment of the lock assembly 200 is shown. In this exemplary embodiment, the lock assembly 200 includes lock cylinder 202, latch 220 and latch holder 222. The latch 220 is secured to the lock cylinder 202 and is configured to mate with latch holder 222. The latch holder 222 is secured to the top wall 126 of the upper body section 122 of the enclosure body 120. In this embodiment, when the lock cylinder 202 is rotated from the open position, seen in FIG. 12, to the locked position, seen in FIG. 13, the latch 220 engages the latch holder 222 to lock the cover assembly 160 to the enclosure body 120 to secure the network devices within the security enclosure 100.

While illustrative embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description.

What is claimed is:

1. A security enclosure for mounted network devices, comprising:
an adjustable enclosure body having an upper body section and a lower body section, the upper body section having an upper top wall, first and second upper side walls extending from the upper top wall, an upper rear opening and an upper front opening, and the lower body section having a lower bottom wall, first and second lower side walls extending from the lower bottom wall, a lower rear opening and a lower front opening;
wherein the first side wall of the upper body section includes at least one first hem and at least a portion the first side wall of the lower body section is positioned within the at least one first hem such that the first side wall of the lower body section can interlock with and slide within the at least one first hem to facilitate the expansion or retraction of the height of the enclosure body, and wherein the second side wall of the upper body section includes at least one second hem and at least a portion the second side wall of the lower body section is positioned within the at least one second hem such that the second side wall of the lower body section can interlock with and slide within the at least one second hem to facilitate the expansion or retraction of the height of the enclosure body;
an adjustable cover operatively connected to the upper body section or the lower body section such that the cover can be moved between closed and open positions relative to the upper and lower front openings, and wherein the cover has a lock assembly to lock the cover to the enclosure body when the cover is in the closed position.

2. A security enclosure for mounted network devices, comprising:
an adjustable enclosure body having an upper body section and a lower body section, the upper body section having an upper top wall, first and second upper side walls extending from the upper top wall, an upper rear opening and an upper front opening, and the lower body section having a lower bottom wall, first and second lower side walls extending from the lower bottom wall, a lower rear opening and a lower front opening;
wherein the first side wall of the upper body section includes at least one first hem and at least a portion the first side wall of the lower body section is positioned within the at least one first hem such that the first side wall of the lower body section is movable within the at least one first hem, and wherein the second side wall of the upper body section includes at least one second hem and at least a portion the second side wall of the lower body section is positioned within the at least one second hem such that the second side wall of the lower body section is movable within the at least one second hem such that the upper body section is movable relative to the lower body section;
an adjustable cover having an upper cover section and a lower cover section that is removably attached to and movable relative to the upper cover section, wherein one of the upper cover section or the lower cover section is operatively connected to the upper body section or the lower body section such that the cover can be moved between closed and open positions relative to the upper and lower front openings, and wherein the cover has a lock assembly to lock the cover to the enclosure body when the cover is in the closed position.

3. A security enclosure for mounted network devices, the security enclosure comprising:
an enclosure body for connection to a front face of the rack, the enclosure body having an upper body section having an upper rear opening and an upper front opening and a lower body section having a lower rear opening and a lower front opening, the upper body section being removable attached to and movable relative to the lower body section such that the upper body section is in a telescoping relationship with the lower body section to facilitate the expansion or retraction of a height of the enclosure body; and
a cover having an upper cover section and a lower cover section, the upper cover section being interlocked to the lower cover section such that the upper cover section and the lower cover section can slide relative to each other to expand or retract a height of the cover, wherein one of the upper cover section or the lower cover section is operatively connected to the enclosure body such that the cover can be moved between a closed position and an open position relative to the upper and lower front openings.

4. The security enclosure according to claim 3, wherein the cover further comprises a number sequence on an inner surface representing rack unit heights.

5. The security enclosure according to claim 3, wherein the upper body section further comprises a top wall, a first upper body side wall extending from the top wall and a second upper body side wall extending from the top wall, wherein the lower body section further comprises a bottom wall, a first lower body side wall extending from the bottom wall and second lower body side wall extending from the bottom wall, wherein the first upper body side wall is configured to interlock with the first lower body side wall, and wherein the second upper body side wall is configured to interlock with the second lower body side wall such that the top wall, first and second upper bodies, first and second lower bodies and bottom wall form a hollow body.

6. The security enclosure according to claim 5, wherein the first upper body side wall has at least one hem, and wherein a portion of the first lower body side wall slides within the at least one hem of the first upper body side wall.

7. The security enclosure according to claim 5, wherein the second upper body side wall has at least one hem, and wherein a portion of the second lower body side wall slides within the at least one hem of the second upper body side wall.

8. The security enclosure according to claim 3, wherein the cover is operatively connected to the enclosure body using at least one hinge, and the cover pivots between the closed position and the open position.

9. The security enclosure according to claim 8, wherein the at least one hinge comprises a separable hinge to facilitate disconnecting the cover from the enclosure body, wherein the separable hinge cannot be disconnected when the cover is in the closed position and wherein the separable hinge can be disconnected when the cover is in the open position such that the cover can be disconnected from the enclosure body.

10. The security enclosure according to claim 3, wherein the cover is operatively connected to the enclosure body using a plurality of hinges, and the cover pivots between the closed position and the open position.

11. The security enclosure according to claim 10, wherein the plurality of hinges comprise separable hinges such that the cover can be disconnected from the enclosure body.

12. The security enclosure according to claim 3, wherein the cover further comprises a lock assembly to lock the cover in the closed position.

13. The security enclosure according to claim 3, wherein the lower cover section includes at least one hem and at least a portion the upper cover section is positioned within the at least one hem such that the upper cover section is removably attached to the lower cover section and movable within the hem.

14. The security enclosure according to claim 13, wherein the at least one hem includes a number sequence on an outer surface representing rack unit heights.

15. The security enclosure according to claim 3, wherein the upper cover section includes at least one vent, and wherein the lower cover section includes at least one vent.

16. The security enclosure according to claim 3, wherein the cover further comprises at least one cover interlock that permits the movement of the upper cover section relative to the lower cover section when released and that inhibits the movement of the upper cover section relative to the lower cover section when locked.

17. A security enclosure for mounted network devices, the security enclosure comprising:
an enclosure body for connection to a front face of the rack, the enclosure body having an upper body section interlocked with a lower body section such that the upper body section is in a telescoping relationship with the lower body section; and
a cover having an upper cover section and a lower cover section, the upper cover section being interlocked to the lower cover section such that the upper cover section and the lower cover section can slide relative to each other to expand or retract a height of the cover, wherein one of the upper cover section or the lower cover section is operatively connected to the enclosure body such that the cover can be moved between a closed position and an open position, the cover having a lock assembly to lock the cover in the closed position.

18. The security enclosure according to claim 17, wherein the upper body section comprises a top wall, a first upper body side wall extending from the top wall and a second upper body side wall extending from the top wall; and the lower body section comprises a bottom wall, a first lower body side wall extending from the bottom wall and second lower body side wall extending from the bottom wall,
wherein the first upper body side wall is configured to interlock with the first lower body side wall, and wherein the second upper body side wall is configured to interlock with the second lower body side wall such that the upper body section is in a telescoping relationship relative to the lower body section.

19. The security enclosure according to claim 17, wherein the cover comprises an upper cover section interlocked with a lower cover section such that the upper cover section is movable relative to the lower cover section.

20. The security enclosure according to claim 19, wherein the lower cover section includes at least one hem and at least a portion the upper cover section is positioned within the at least one hem such that the upper cover section is removably attached to the lower cover section and movable within the hem.

* * * * *